United States Patent
Lam et al.

(10) Patent No.: US 7,454,726 B2
(45) Date of Patent: Nov. 18, 2008

(54) TECHNIQUE FOR GENERATING INPUT STIMULUS TO COVER PROPERTIES NOT COVERED IN RANDOM SIMULATION

(75) Inventors: William K. Lam, Newark, CA (US); Yick Kei Wong, Mountain View, CA (US); Harihara Ganesan, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 248 days.

(21) Appl. No.: 11/353,672

(22) Filed: Feb. 13, 2006

(65) Prior Publication Data

US 2007/0192753 A1  Aug. 16, 2007

(51) Int. Cl.
G06F 17/50 (2006.01)

(52) U.S. Cl. ............................................. 716/5; 716/4

(58) Field of Classification Search .................. 716/4–5; 714/124, 128, 722, 726, 727, 729, 733, 736
See application file for complete search history.

(56) References Cited

U.S. PATENT DOCUMENTS

| | | | | |
|---|---|---|---|---|
| 5,724,504 A | * | 3/1998 | Aharon et al. | 714/33 |
| 5,831,998 A | * | 11/1998 | Ozmizrak | 714/741 |
| 5,922,079 A | * | 7/1999 | Booth et al. | 714/26 |
| 6,523,151 B2 | * | 2/2003 | Hekmatpour | 716/4 |
| 6,687,662 B1 | * | 2/2004 | McNamara et al. | 703/14 |
| 7,007,251 B2 | * | 2/2006 | Hekmatpour | 716/4 |
| 7,203,882 B2 | * | 4/2007 | Fine et al. | 714/741 |
| 7,278,056 B2 | * | 10/2007 | Hekmatpour | 714/37 |

* cited by examiner

*Primary Examiner*—Vuthe Siek
(74) *Attorney, Agent, or Firm*—Osha • Liang LLP

(57) ABSTRACT

A design of an integrated circuit is first verified using directed and/or random test cases. For a cover directive not covered by the directed and/or random test cases, a property is created, where a simulation trace that causes the property to fail covers the cover directive. Thereafter, the property is evaluated, and dependent on the evaluation, the simulation trace is dumped and stored for subsequent exercising of the cover directive.

17 Claims, 6 Drawing Sheets

TECHNIQUE FOR GENERATING INPUT STIMULUS TO COVER PROPERTIES NOT COVERED IN RANDOM SIMULATION

BACKGROUND

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

The design of an integrated circuit, such as any of the ones described with reference to FIG. 2, may be broken down into several steps. Referring now to FIG. 3, in a first step ST30, the overall architecture and behavior of the integrated circuit is designed. In a next step ST32, a specification of the design's high-level functionality is typically expressed at the register-transfer level (RTL) using a hardware description language (HDL). RTL description (also known as "register transfer logic") is a description of an integrated circuit in terms of data flow between registers, which store information between clock cycles in the integrated circuit. The RTL description specifies what and where this information is stored and how it is passed through the integrated circuit during its operation.

After describing the design's high-level functionality, the function design of the integrated circuit is implemented into gate level logic ST34. Such implementation may be performed using, for example, logic synthesis electronic design automation (EDA) software. Then, in a next step ST36, the logical design is implemented into physical components representing transistors and their interconnecting wires. Such physical implementation may be performed using routing and placement EDA software. After the physical design is completed, the design is released for subsequent manufacture and production of the integrated circuit ST38.

After each of the steps described above, verification is typically performed to ensure that the step was performed correctly. Generally, such verification involves testing the integrated circuit design over various combinations of input, internal, and process constraints. As integrated circuits continue to become more complex over time, the need for proper verification of such integrated circuits is becoming increasingly important.

Verification of the behavioral, RTL, and logic design steps is typically heavily reliant on the use of simulation tools to predict the functional response of the design to specified input values. These input values or tests are typically specified manually by the designer and provided as input to a logic simulator together with the corresponding design description.

The vast majority of "bugs" are introduced during the implementation of the RTL design from the behavioral specification. It is during this phase that it is especially important to comprehensively test aspects of the design. A typical technique for a simulation-based verification process involves creating a test plan to target parts of the design that need to be tested. The test plan includes, for example, details of how a circuit block will be verified. Such details may relate to describing the signals and/or properties that are to be verified, whether simulation will occur, and whether directed or random test vectors will be used.

The properties that the design needs to adhere to are added as assertions in the design. Along with these assertions, cover directives may also be added to the design to identify all parts of an RTL design that need to be exercised by the simulation. Simulations are targeted to exercise, or "cover," these assertions and cover directives. For this, directed test cases are written manually or test cases are generated randomly. In other words, the behavioral models or properties of a design may be verified during the simulation of directed or random vectors.

Directed test cases require manually inserting code into the design description to test the aspects of the design. However, it is increasingly difficult to write test cases for testing each and every aspect of the design. Such an endeavor may prove to be extremely tedious and time-consuming.

Random tests involve generating millions of test vectors for verifying the design. While random testing saves some of the time otherwise needed to manually write directed tests, random testing, at least in one respect, is inefficient relative to directed tests in that with random tests, certain aspects of the design may not be verified. In other words, with random tests, certain properties of the design may be left uncovered.

SUMMARY

According to one aspect of one or more embodiments of the present invention, a method of verifying a design of an integrated circuit comprises: at least one of simulating a plurality of random test cases for the design and simulating a plurality of directed test cases for the design; identifying a cover directive not covered by the simulating the plurality of random tests and the simulating the plurality of directed test cases; creating a property, where a simulation trace that causes the property to fail covers the cover directive; evaluating the property; and storing the simulation trace based on the evaluating.

According to another aspect of one or more embodiments of the present invention, a computer system comprises: a processor; a memory operatively connected to the processor; and instructions residing in the memory and executable by the processor, where the instructions comprise instructions to (i) at least one of simulate a plurality of random test cases for a design of an integrated circuit and simulate a plurality of directed test cases for the design, (ii) identify a cover directive not covered by the simulation of the plurality of random tests and the simulation of the plurality of directed test cases, (iii) create a property dependent on the identification, where a simulation trace that causes the property to fail covers the cover directive, (iv) evaluate the property, and (v) store the simulation trace based on the evaluation.

According to another aspect of one or more embodiments of the present invention, a computer-readable medium having instruction therein, where the instructions are for: at least one of simulating a plurality of random test cases for a design of an integrated circuit and simulating a plurality of directed test cases for the design; identifying a cover directive not covered by the simulating the plurality of random tests and the simulating the plurality of directed test cases; creating a property dependent on the identifying, wherein a simulation trace that causes the property to fail covers the cover directive; evaluating the property; and storing the simulation trace based on the evaluating.

Other aspects and advantages of the invention will be apparent from the following description and the appended claims.

DETAILED DESCRIPTION

Figure 1:
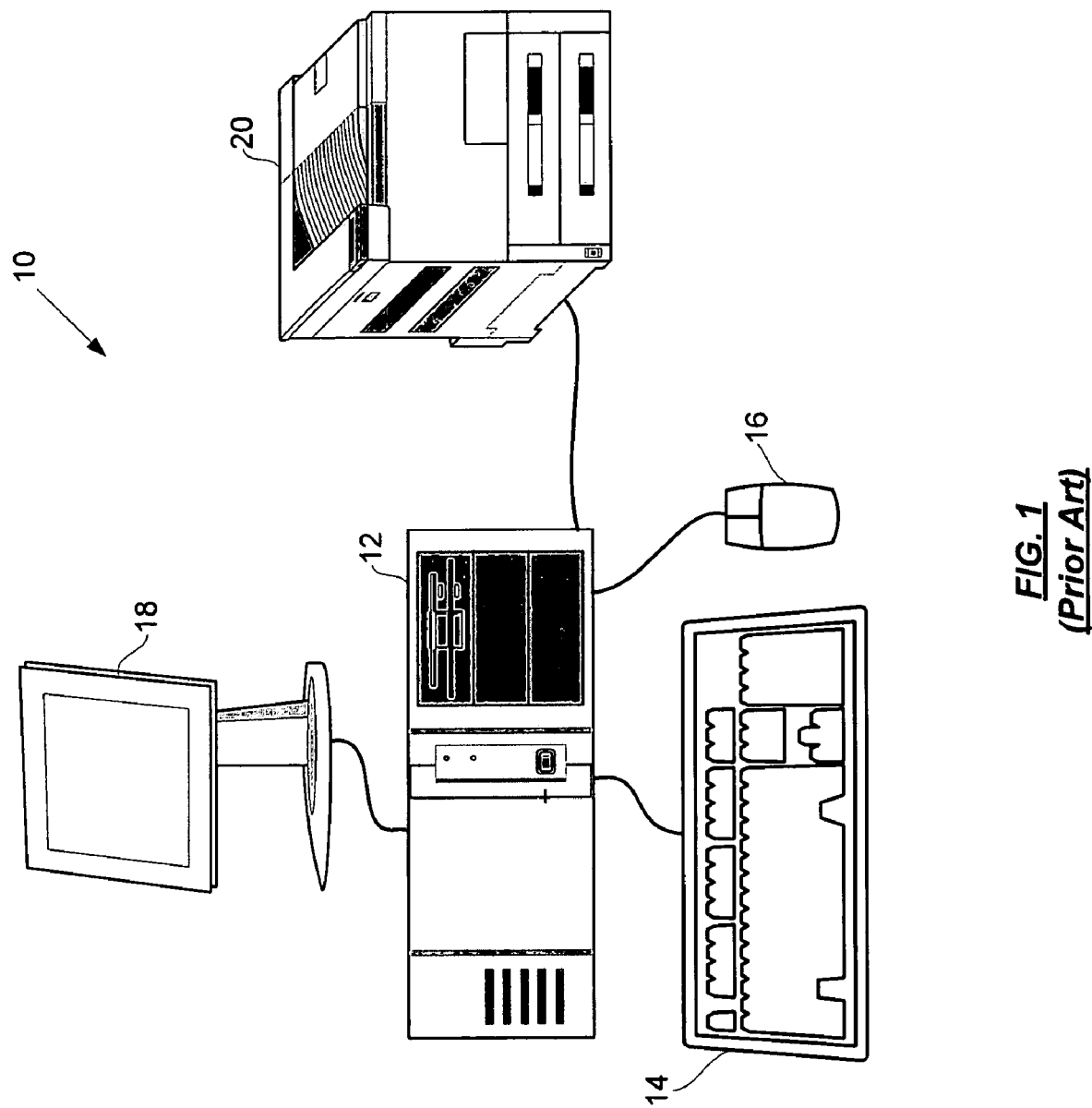
FIG. 1 shows a computer system.
Figure 2:
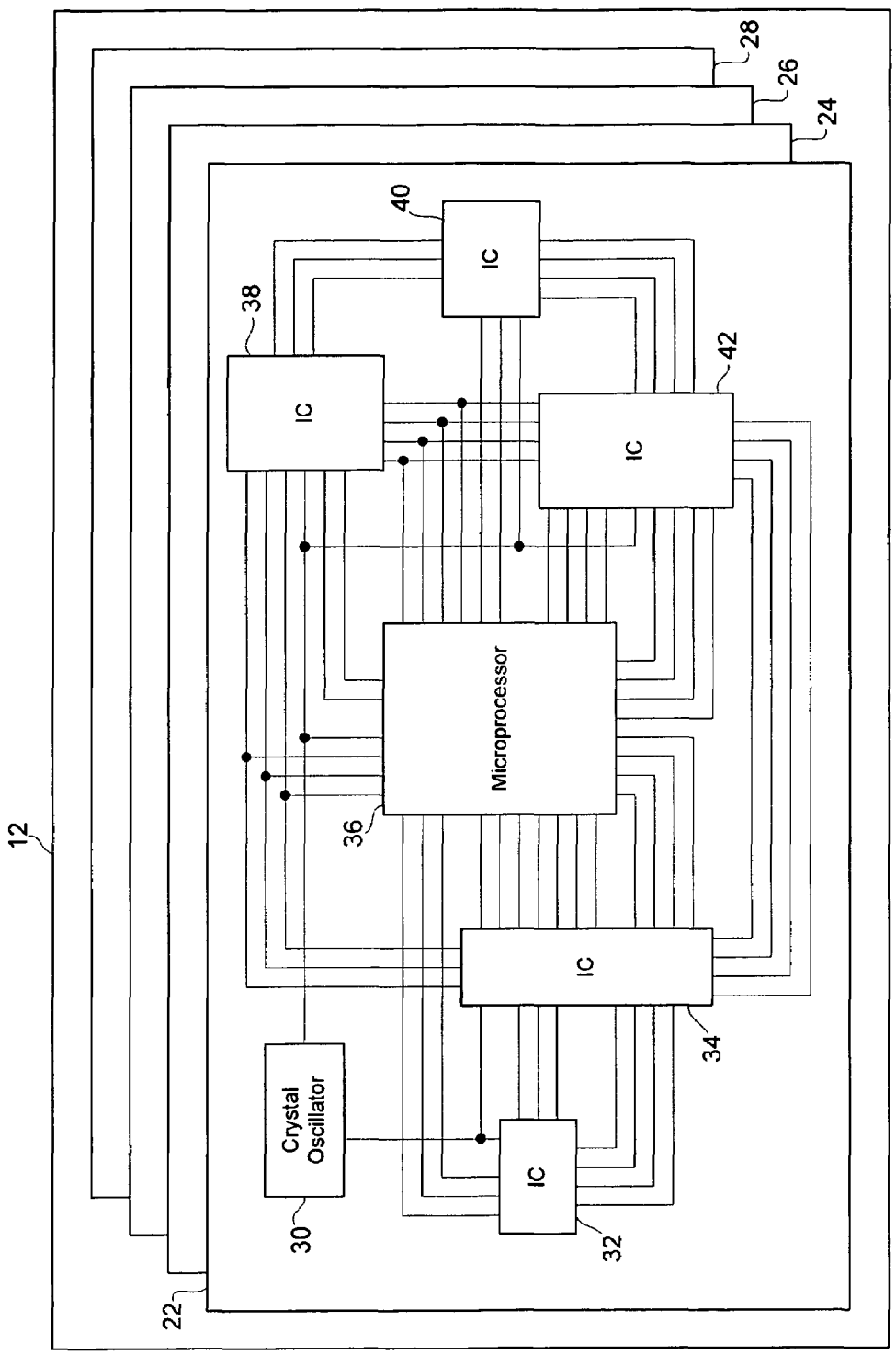
FIG. 2 shows a portion of a computer system.
Figure 3:
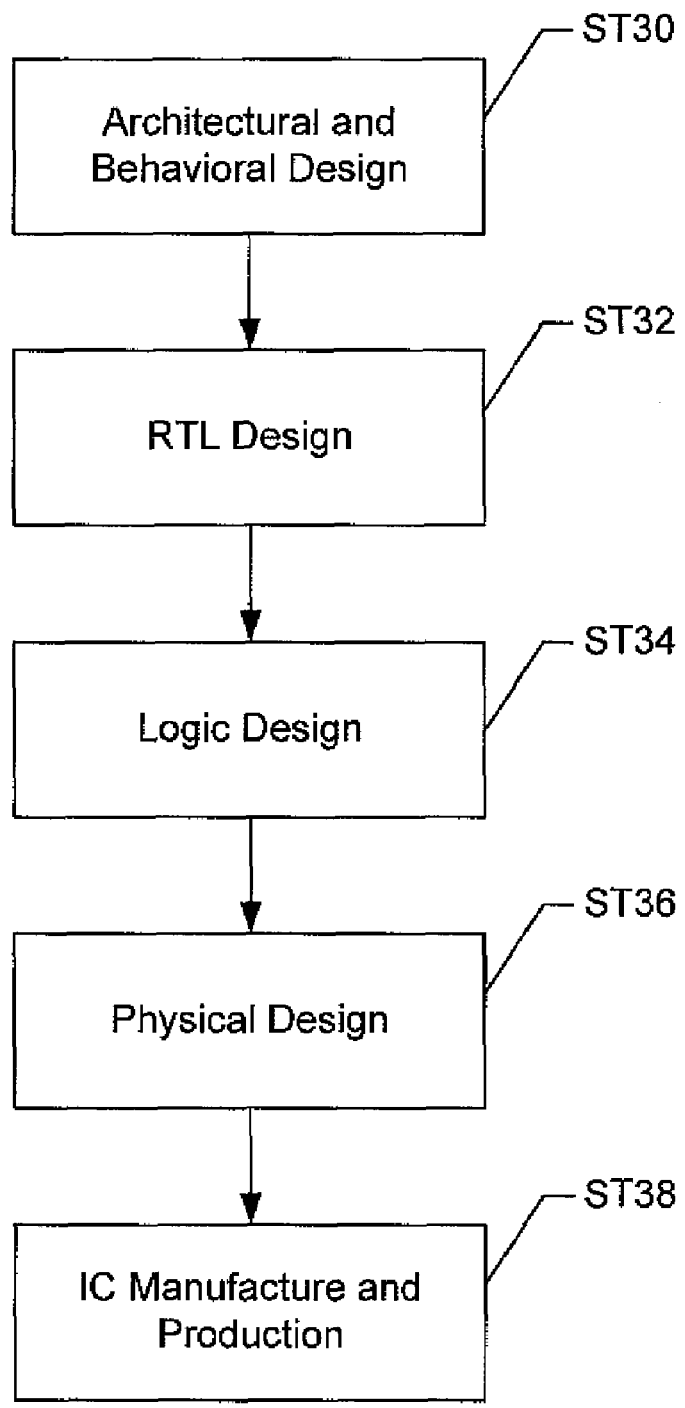
FIG. 3 shows a typical flow process for designing an integrated circuit.

As described above, with only typical directed and/or random tests, it may not be possible, or otherwise extremely difficult, to cover all the properties that need to verified in a design. Embodiments of the present invention relate to a technique for covering the cover directives in a design that are not covered using only typical directed and/or random tests.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

Figure 4:
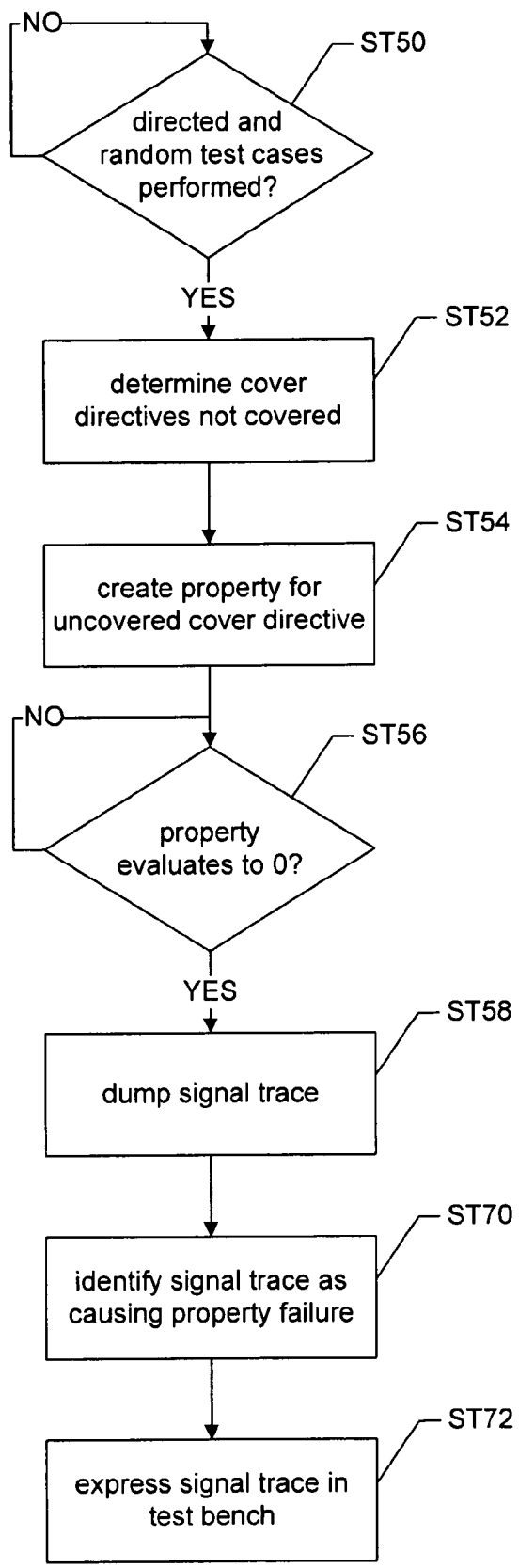
FIG. 4 shows a flow process in accordance with an embodiment of the present invention.

FIG. 4 shows an example of a flow process in accordance with an embodiment of the present invention. In ST50, a determination is made as to whether a certain amount of simulated random and directed test cases have been performed for the verification of a design. For example, in one or more embodiments of the present invention, a determination may be made as to whether the simulations of all random and directed test cases have been performed.

Once the random and directed test cases have been performed as determined in ST50, a list or other collection of the cover directives not covered by the random and directed test cases is generated ST52. For each cover directive not covered by the simulations of the random and directed test cases, one or more embodiments of the present invention provide a technique for generating a trace that may be used to cover the uncovered cover directive.

In ST54, for each cover directive not covered, a property (or assertion) is created (and evaluated in ST56) such that if there is a simulation trace that can fail this property (or assertion), that trace covers the cover directive. For example, if the cover directive is one that was intended to dump a trace when signal S1 is equal to signal S2 (S1==S2), then the created property may be one that fails and dumps a trace when signal S1 is not equal to signal S2 (i.e., !(S1==S2) fails to establish). In the process of creating a simulation trace for a cover directive, the trace should not make other properties/assertions that are already passing in the design fail. In order to achieve this, constraints may be applied on the primary inputs or internal signals of the design or block being verified so that the simulation only applies valid stimulus while trying to prove or falsify a property. In other words, if a particular condition is being tested for failure, it is important to ensure that constrained inputs or internal signals of the design are not causing the condition to fail. Otherwise, a signal trace dumped in response to failure of the condition may be indeterministic as to the cause of the condition failure.

Figure 5:
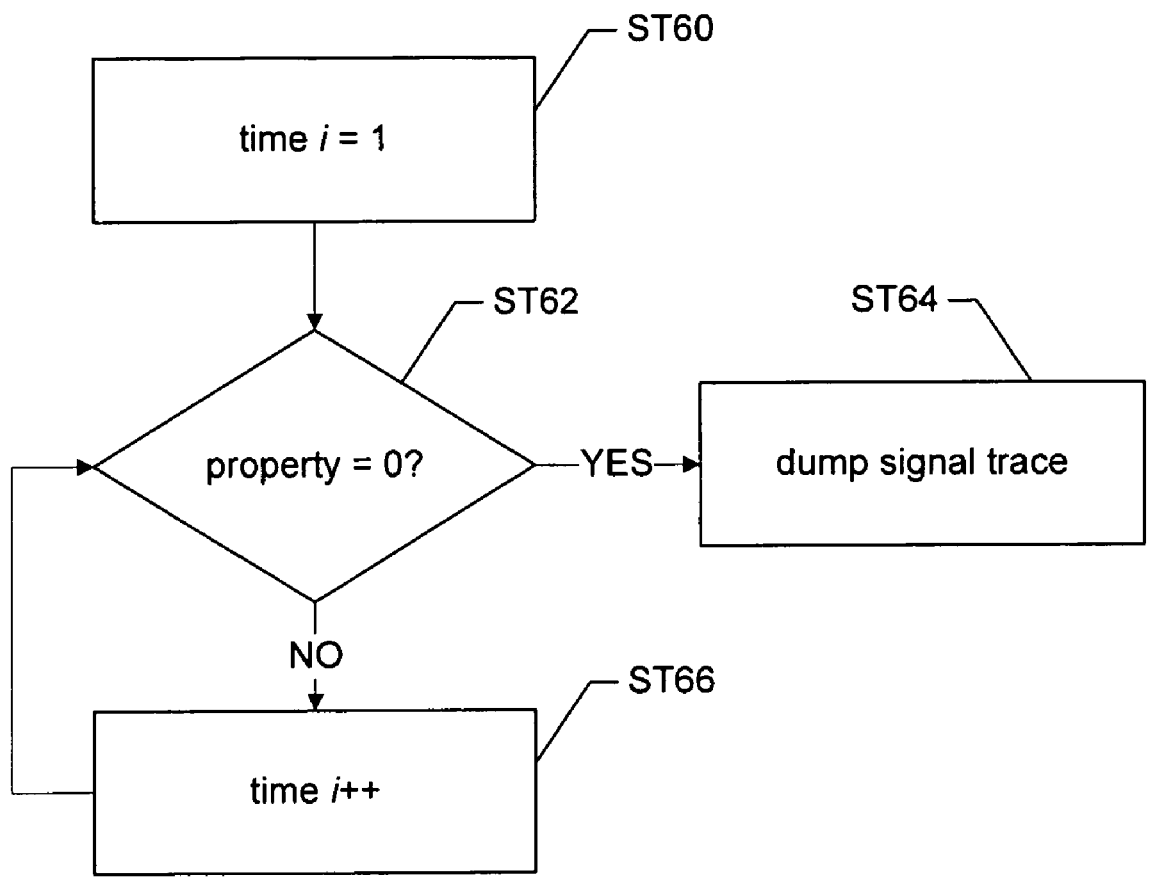
FIG. 5 shows a flow process in accordance with an embodiment of the present invention.

FIG. 5 shows an example of a flow process in accordance with an embodiment of the present invention. At time i=1 ST60, a property is tested with the following expression:

$$!C + !A_1 + !A_2 + \ldots + !A_i,$$

where C contains the condition being tested for failure (e.g., the condition being (S1==S2)), and where $A_1, A_2, \ldots A_i$ represent constraints that must be satisfied during the test for failure of condition C. The constraints $A_1, A_2, \ldots A_i$ must pass during the test, whereby passing is denoted as each constraint being high. When the constraints $A_1, A_2, \ldots A_i$ remain high, the portion of the expression containing constraints $A_1, A_2, \ldots A_i$ evaluates to 0. If condition C fails (i.e., !(S1==S2) evaluates to 1), then the portion of the expression containing !C evaluates to 0.

If, in ST62, the property evaluates to 0, this indicates successful testing for failure of condition C, in which case the corresponding signal trace is dumped ST64. Otherwise, if in ST62, the property evaluates to 1, this indicates that either one of the constraints $A_1, A_2, \ldots A_i$ failed the test or condition C did not fail. In such a case, a next cycle is entered ST66, and the property is reevaluated for failure of condition C while constraints $A_1, A_2, \ldots A_i$ are passing ST62.

Now referring back to the flow process shown in FIG. 4, if in ST56, the property evaluates to 0 (or to another indication signifying failure of the condition being tested while other constraints remain passing), a signal trace is dumped in ST58 as described above with reference to FIG. 5. Once a simulation-based verification tool identifies the signal trace as causing failure of the newly created property (which covers the cover directive not covered by previous random and directed test cases) ST70, the signal trace that caused the failure may be written out as part of a test bench ST72.

Those skilled in the art will note that a test bench may include the signal trace and code to simulate the signal trace. Further, those skilled in the art will note that from the test bench, it may be possible to create signal trace dumps in standard formats (e.g., vcd, vpd, fsdb). Then, the test bench is added to a test plan or a test case regression suite of the design, so that subsequent tests of the design are ensured to cover the cover directives not covered during the previous verification step of only random and directed test cases.

Figure 6:
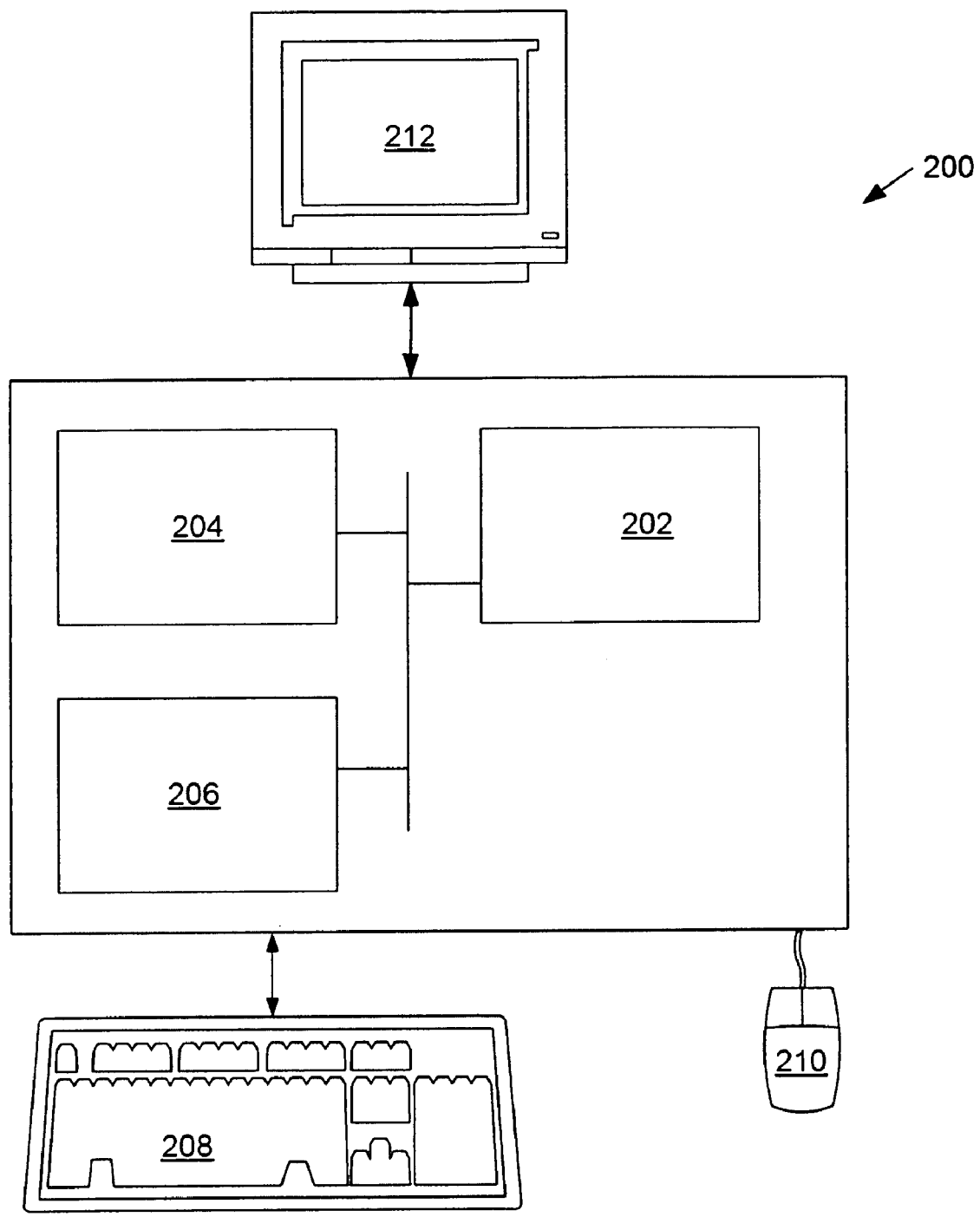
FIG. 6 shows a computer system in accordance with an embodiment of the present invention.

Further, one or more embodiments of the present invention may be associated with virtually any type of computer system, including multiprocessor and multithreaded uniprocessor systems, regardless of the platform being used. For example, as shown in FIG. 6, a networked computer system 200 includes at least one processor 202, associated memory 204, a storage device 206, and numerous other elements (not shown) and functionalities typical of modern computer systems. The networked computer system 200 may also include input means, such as a keyboard 208 and a mouse 210, and output means, such as a monitor 212. The networked computer system 200 is connected to a local area network (LAN) or a wide area network (e.g., the Internet) via a network interface connection (not shown). Those skilled in the art will appreciate that these input and output means may take other forms. Further, those skilled in the art will appreciate that one or more elements of the networked computer system 200 may be remotely located and connected to the other elements over a network. Further, software instructions to perform one or more embodiments of the present invention may be stored on a computer readable medium such as a compact disc (CD), a diskette, a tape, a file, a hard drive, or any other computer-readable storage device.

Advantages of the present invention may include one or more of the following. In one or more embodiments of the present invention, formal techniques may be used to generate test cases that may reduce the amount of time needed to get better coverage of functional checks in a design of an integrated circuit, In one or more embodiments of the present invention, by generating test cases to cover properties and cases not covered with random and directed test cases, a stimulus vector size that is targeted to cover a property may be reduced.

In one or more embodiments of the present invention, one or more properties of a design not verified by directed and random test cases may be verified.

In one or more embodiments of the present invention, existing formal verification tools may be used to increase verification coverage or efficiency and find design bugs.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of verifying a design of an integrated circuit, comprising:
   at least one of simulating a plurality of random test cases for the design and simulating a plurality of directed test cases for the design;
   identifying a cover directive not covered by the simulating the plurality of random tests and the simulating the plurality of directed test cases;
   creating a property dependent on the identifying, wherein constraints are applied to one or more inputs or internal signals of the design, and a simulation trace that causes the property to fail covers the cover directive;
   evaluating the property; and
   storing the simulation trace based on the evaluating;
   wherein the property being defined as a sum of $!C$, $!A_1$, $!A_2$, and $!A_i$,
      C comprises a condition being tested, and
      $A_1, A_2$, and $A_i$ represent constraints that each evaluate high when passing.

2. The method of claim 1, further comprising:
   running the simulation trace to cover the cover directive.

3. The method of claim 1, wherein storing the simulation trace occurs in response to the property evaluating as failing.

4. The method of claim 1, wherein the simulation trace is not stored in response to the property evaluating as passing.

5. The method of claim 1, further comprising:
   expressing the simulation trace as a test bench; and
   adding the test bench to a regression suite for the design.

6. The method of claim 1, evaluating the property comprising:
   testing a condition of the design.

7. A computer system, comprising:
   a processor;
   a memory operatively connected to the processor; and
   instructions residing in the memory and executable by the processor, the instructions comprising instructions to:
   at least one of simulate a plurality of random test cases for a design of an integrated circuit and simulate a plurality of directed test cases for the design,
   identify a cover directive not covered by the simulation of the plurality of random tests and the simulation of the plurality of directed test cases,
   create a property dependent on the identification, wherein constraints are applied to one or more inputs or internal signals of the design, and a simulation trace that causes the property to fail covers the cover directive,
   evaluate the property, and
   store the simulation trace based on the evaluation;
   wherein the property being defined as a sum of $!C$, $!A_1$, $!A_2$, and $!A_i$,
      C comprises a condition being tested, and
      $A_1, A_2, A_i$ represent constraints that each evaluate high when passing.

8. The computer system of claim 7, further comprising instructions to:
   run the simulation trace to cover the cover directive.

9. The computer system of claim 7, wherein storing the simulation trace occurs in response to the property evaluating as failing.

10. The computer system of claim 7, wherein the simulation trace is not stored in response to the property evaluating as passing.

11. The computer system of claim 7, further comprising instructions to:
   express the simulation trace as a test bench; and
   add the test bench to a regression suite for the design.

12. The computer system of claim 7, wherein the instructions to evaluate the property comprise instructions to:
   test a condition of the design.

13. A computer-readable medium having instruction therein, the instructions for:
   at least one of simulating a plurality of random test cases for a design of an integrated circuit and simulating a plurality of directed test cases for the design;
   identifying a cover directive not covered by the simulating the plurality of random tests and the simulating the plurality of directed test cases;
   creating a property dependent on the identifying, wherein constraints arc applied to one or more inputs or internal signals of the design, and a simulation trace that causes the property to fail covers the cover directive;
   evaluating the property; and
   storing the simulation trace based on the evaluating;
   wherein the property being defined as a sum of $!C$, $!A_1$, $!A_2$, and $!A_i$,
      C comprises a condition being tested, and $A_1$, $A_2$, and $A_i$, represent constraints that each evaluate high when passing.

14. The computer-readable medium of claim 13, further comprising instructions for:

running the simulation trace to cover the cover directive.

15. The computer-readable medium of claim 13, wherein storing the simulation trace occurs in response to the property evaluating as failing.

16. The computer-readable medium of claim 13, further comprising instructions for:

expressing the simulation trace as a test bench; and adding the test bench to a regression suite for the design.

17. The computer-readable medium of claim 13, the instructions for evaluating the property comprising instructions for:

testing a condition of the design.

\* \* \* \* \*